(12) United States Patent
Johnson et al.

(10) Patent No.: US 10,436,819 B1
(45) Date of Patent: Oct. 8, 2019

(54) CONSTANT PRESSURE PIN TIP FOR TESTING INTEGRATED CIRCUIT CHIPS

(71) Applicant: Johnstech International Corporation, Minneapolis, MN (US)

(72) Inventors: David A. Johnson, Wayzata, MN (US); John E. Nelson, Brooklyn Park, MN (US); Jose E. Lopez, Sunnyvale, CA (US)

(73) Assignee: Johnstech International Corporation, Minneapolis, MN (US)

( * ) Notice: Subject to any disclaimer, the term of this patent is extended or adjusted under 35 U.S.C. 154(b) by 0 days.

(21) Appl. No.: 15/944,246

(22) Filed: Apr. 3, 2018

Related U.S. Application Data

(63) Continuation-in-part of application No. 15/202,889, filed on Jul. 6, 2016, now Pat. No. 9,958,499.

(60) Provisional application No. 62/189,628, filed on Jul. 7, 2015.

(51) Int. Cl.
*G01R 1/067* (2006.01)
*G01R 31/28* (2006.01)

(52) U.S. Cl.
CPC ..... *G01R 1/06738* (2013.01); *G01R 1/06716* (2013.01); *G01R 31/2891* (2013.01)

(58) Field of Classification Search
CPC ............ G01R 1/06738; G01R 1/06716; G01R 31/2891
USPC ........................................ 324/754.03; 439/66
See application file for complete search history.

(56) References Cited

U.S. PATENT DOCUMENTS

| | | | |
|---|---|---|---|
| 6,854,981 B2 | 2/2005 | Nelson | |
| 7,059,866 B2 * | 6/2006 | Gilk | G01R 1/0466 439/66 |
| 7,445,465 B2 | 11/2008 | Lopez et al. | |
| 7,639,026 B2 | 12/2009 | Shell et al. | |
| 7,737,708 B2 | 6/2010 | Sherry | |
| 2006/0216962 A1 | 9/2006 | Gilk | |

* cited by examiner

*Primary Examiner* — Farhana A Hoque
(74) *Attorney, Agent, or Firm* — Hamre, Schumann, Mueller & Larson, P.C.

(57) ABSTRACT

A structure and method of constructing a tip for a contact pin used in IC test housing for testing integrated circuits. As the pin is deflected when the device under test (DUT) pad engaged the tip of the pin, the tip pressure normally increases as the elastomers biasing the pin are engaged. This causes the elastomer supporting the tip to increase pressure. By widening the tip as it rolls, the pressure is maintained more constant. Also, as the top wears, the pressure on the DUT will be reduced. By making the contact area of the tip to DUT smaller as it wears, the pressure can be made more constant.

11 Claims, 16 Drawing Sheets

US 10,436,819 B1

CONSTANT PRESSURE PIN TIP FOR TESTING INTEGRATED CIRCUIT CHIPS

CROSS REFERENCE TO RELATED APPLICATIONS

This application claims priority from issued U.S. Pat. No. 7,639,026; issued U.S. Pat. No. 6,854,981, issued U.S. Pat. No. 7,445,465, issued U.S. Pat. No. 7,059,866; issued U.S. Pat. No. 7,737,708; US Publication No. 2006/0216962, and Ser. No. 15/202,889 (to Johnson et. al.) and all of common ownership and further are all hereby incorporated by reference along with all applications from which they claim priority.

FIELD OF THE DISCLOSURE

The present invention is directed to devices for testing of integrated circuit chips or dice from IC wafers. More narrowly, however, the disclosure deals with test contacts for interfacing pads or leads of a device to be tested with corresponding pads of a device under test (DUT). In addition, improvements in the pin contact tip and shape of the pin as a whole which contacts the DUT during test are disclosed.

BACKGROUND

The testing of integrated circuit devices is performed to ensure that such devices, when sold to a customer, are of as high a degree of quality as possible. Various types of test apparatus have been utilized over the years to accomplish testing. Typically, a tester includes a printed circuit board which has defined thereon a plurality of conductive traces. These traces on the circuit board, or load board, are associated with corresponding functions of the test apparatus.

In order to accomplish testing, it is necessary to interconnect a lead, in the case of a leaded device under test, or a pad, of a nonleaded device under test, to a corresponding trace on the load board. A test set or test socket having a plurality of contacts is interposed between the device under test and the load board in order to effectuate interconnection. A contact is engaged, at an upper end thereof, by the lead or pad of the DUT, depending upon the type of DUT being tested, with its corresponding trace on the load board. A lower end of the contact is in engagement with a trace on the load board.

As technology has progressed, the size, shape and electronic properties of contacts have evolved in response to the construction of test sets and load boards and the architecture of devices to be tested. At one time, it was considered necessary to have a wiping action at the various locations of engagement of the contact ends by the lead or pad of the DUT and the pad on the load board. Such wiping action was deemed to facilitate a good transmission path through the contact because of a good connection at either end thereof. It has become more apparent, however, that the measure of wiping action formerly considered necessary to maintain a good transmission path need not be of a degree as was formerly believed. Further, it has been recognized that excessive wiping action can damage component parts at the various points of engagement of the contact, and thereby significantly decrease the life of the test socket and tester load board. Consequently, various attempts have been made to minimize abrading of one surface relative to another. Various elastomeric mounting means have been devised in an effort to minimize abrasion and consequent deterioration of components.

Another problem which has been discovered is the diminishment of effectiveness of testing as a result of the employment of matte tin on leads and pads of various types of DUTs. Such a material is applied to DUT components which facilitate soldering to an ultimate host circuit board. Because of its softness, however, such materials are often shed as debris which can fall into the test housing and disrupt the testing.

It is to these dictates and shortcomings of the prior art that the present disclosure is directed. The present invention is a contact having a structure which minimizes tin buildup on the contact.

BRIEF SUMMARY

To assist the reader in preparing to digest the detailed description and claims below, a short summary has been provided. It is far from complete and only provides a glimpse of the invention concepts. It is not intended to define the scope of the invention. The claims perform that function.

Disclosed is a method of reducing tip pressure between a device under test (DUT) and a test pin in a test housing, the pin having a tip which has a contact surface comprising:
  a. forming the tip of the pin so that it has a curvature on its contact surfaces, so that when it engages a contact of a DUT, the area of contact between the tip and DUT travels along the curved tip surface;
  b. forming a widening the tip contact surface from a point of initial contact with the DUT to a point of final contact with the DUT as it is inserted into the housing, where the tip contact surface is wider toward the point of final contact.

Also disclosed is a method of reducing tip pressure between a device under test (DUT) and a test pin in a test housing, the pin having a tip which has a contact surface comprising:
  a. forming the tip of the pin so that it has a curvature on its contact surfaces, so that when it engages a contact of a DUT, the area of contact between the tip and DUT travels along the curved tip surface;
  b. forming a declining tip height along the tip contact surface from a point of initial contact with the DUT to a point of final contact with the DUT as it is inserted into the housing, where the tip height is lower toward the point of final contact.
  1. A controlled pressure test pin for use in a test pin housing on a device under test (DUT) the pin comprising:
    a. a tip formed at an end of the test pin, the tip being configured to engage a contact on the DUT from an initial point where the tip first engages the DUT to a final point where the DUT is in a test position in the housing, during which the pin is deflected into the housing,
    b. said tip having a top surface configured to engage the DUT, said top surface being narrower at the point of initial engagement than at said final point, so that pressure between the tip and the DUT will tend to be more constant instead of rising as tip deflection increases.

Also disclosed is a controlled pressure test pin for use in a test pin housing on a device under test (DUT) the pin comprising:
  a. a tip formed at an end of the test pin, the tip being configured to engage a contact on the DUT from an initial point where the tip first engages the DUT to a final point where the DUT is in a test position in the housing, during which the pin is deflected into the housing, b. said tip having a top surface configured to engage the DUT, said top surface being higher at the point of initial engagement than at said final point so that pressure between the tip and the DUT will tend to be more constant instead of rising as tip deflection increases.

Also disclosed is a controlled pressure test pin for use in a test pin housing on a device under test (DUT) the pin comprising:

a. a tip formed at an end of the test pin, the tip being configured to engage a contact on the DUT from an initial point where the tip first engages the DUT to a final point where the DUT is in a test position in the housing, during which the pin is deflected into the housing, b. said tip having a top surface configured to engage the DUT, said top surface being higher at the point of initial engagement than at said final point so that pressure between the tip and the DUT will tend to be more constant instead of rising as tip deflection increases; and c. said tip having a top surface configured to engage the DUT, said top surface being higher at the point of initial engagement than at said final point so that pressure between the tip and the DUT will tend to be more constant instead of rising as tip deflection increases.

Also disclosed is a method of maintaining constant tip pressure between a device under test (DUT) and a test pin in a test housing as a tip wears from repeated use:

a. forming the pin to include a pin tip and a neck joining the pint tip to the pin;

b. forming the pin tip with a contact surface to engage said DUT; and c. forming the neck to be tapered from its widest point at the pin tip surface and being progressively narrower away from the top surface, so that as the pin tip contact surface is worn away from repeated contact with a DUT, the pin tip shortened and the width surface area of the contact surface is decreased as it wears down the tapered neck, thereby maintaining the tip to DUT pressure.

Also disclosed is a method further including the step of forming the tip of the pin so that it has a curvature on its contact surfaces, so that when it engages a contact of a DUT, the area of contact between the tip and DUT travels along the curved tip surface.

Also disclosed is a controlled pressure test pin for use in a test pin housing testing a device under test (DUT), the pin having any or all of the following elements:

a. a test pin having sidewalls;

b. a tip formed at a distal end of the test pin, the tip having tip sidewalls and a distal tip surface, thereby defining a tip surface area between the tip sidewalls at said distal tip surface, and being the surface area of the tip during which the pin is deflected into the housing; and c. said tip including a neck portion extending from said distal tip surface toward said distal end of said pin, said neck portion having a tapering width from said distal tip surface toward said distal end portion, so that as said distal tip surface is worn by repeated contact with said DUT, said tip surface area is progressively decreased.

Also disclosed is a controlled pressure test pin system configured to compensate for pin wear, for use in a test pin housing which receives a device under test (DUT); the pin any or all of the following elements:

a. a tip formed at a distal end of the test pin, the tip being configured to engage a contact on the DUT where the DUT is in a test position in the housing, during which the pin is deflected into the housing against an elastomeric bias force, b. said tip having a top surface configured to engage the DUT, said top surface being higher in the housing at the point of initial engagement than at said final point when deflected by engagement with the DUT; and c. said tip having a top surface configured to engage the DUT, said top surface having a predetermined width, with the tip having a progressively narrowing width as it approaches the test pin distal end, so that when the top surface of the pin wears in response to repeated engagement with the DUT, the width of the top surface will be progressively narrower thereby increasing the tip pressure where it engages the DUT to compensate for decreasing elastomeric bias force as the tip is deflected less as it wears.

Also disclosed is a neck portion including:

a. a tapered portion from the distal tip surface;

b. said tapered portion being joined at one end to a portion of spaced apart sidewalls and a fixed width; and c. said tapered portion being joined at another end to lower neck portion, which in turn is connected to the distal end of the test pin, the lower neck portion having a reverse taper which widens to mate with the distal end of the test pin.

Also disclosed is the lower neck portion further includes a radiussed recess therein.

Also disclosed is a neck portion having at least two tapered sidewalls.

Also disclosed is a neck portion having at least four tapered sidewalls.

Also disclosed is a curved tip and a planar tip.

Also disclosed is a tip having a width and length and wherein said width is tapered.

Also disclosed is a tip having a width and length and wherein said length tapered.

DETAILED DESCRIPTION

This disclosure details a test contact pin for use in a housing intended primarily to test integrated circuit chips or dice (aka device under test DUT).

Prior art test pins necessarily apply an uneven contact force on DUT pads or leads when the DUT is loaded to test. This invention provides as constant a stress as possible between the contact tip and the DUT pad over the life of the contact and as constant a stress as possible during the actuation of the contact. This invention also extends the operating range of the contact by allowing the contact tip to wear a greater distance without falling below a specified pressure.

As constant a stress as possible during the actuation of the contact is accomplished by tapering the tip of the contact in the X-Y direction. At the beginning of the actuation, the force is low and the width of the tip is narrow. Low force on a narrow tip creates a controllable stress at the beginning of the actuation. At the end to the actuation, the force is higher and the width of the tip is wider. High force on a wider tip creates a controllable stress at the end of the actuation. By controlling the changing force during the actuation of the contact and by controlling the changing width of the contact tip during the actuation, a more consistent stress between the contact tip and the DUT pad is achieved during the actuation of the contact.

As constant a stress as possible over the life of the contact is accomplished by tapering the tip of the contact in the Z direction. At the beginning of the life of the contact, tip wear is at its minimum, the contact tip is wide and the contact is able to be actuated to its fully compressed position causing the force to be at its maximum value. High force on a wider tip creates a controllable stress at the beginning of the life of the contact. At the end of the life of the contact, tip wear is at its maximum, the contact tip is narrow and the contact is unable to be actuated to its fully compressed position causing the force to be at its minimum value. Low force on a narrow tip creates a controllable stress at the end of the life of the contact. By controlling the changing force during the life of the contact and by controlling the changing width of the contact tip during the life, a more consistent stress between the contact tip and the DUT pad is achieved during the life of the contact.

By controlling the contact tip taper in both the Z and X-Y directions at the same time, a more consistent stress between the contact tip and DUT pad can be achieved during the actuation of the contact and over the life of the contact.

For example a 11.8 degree taper extends the operating range from 0.0675 mm wear to 0.1175 mm of contact tip wear.

There are various combinations of tapers possible. A) The contact tip taper in the Z direction. B) The contact tip taper in the X or Y or both directions; C) The contact simultaneous tip tapers in both the Z and X or Y or both X and Y directions.

Figure 12:
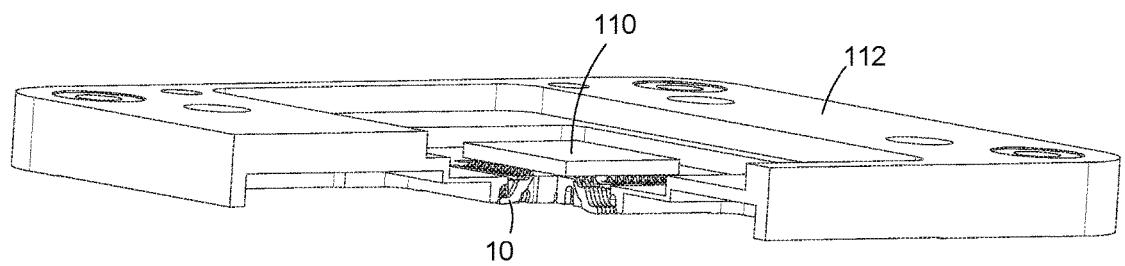
FIG. 12 is a side perspective view, with portions broken away, of a device under test, a housing and test pins.

FIG. 12 illustrates a device under test (DUT) 110 in a housing/socket 112 which contains a plurality of test pins 10 which engage the DUT.

Figure 13:
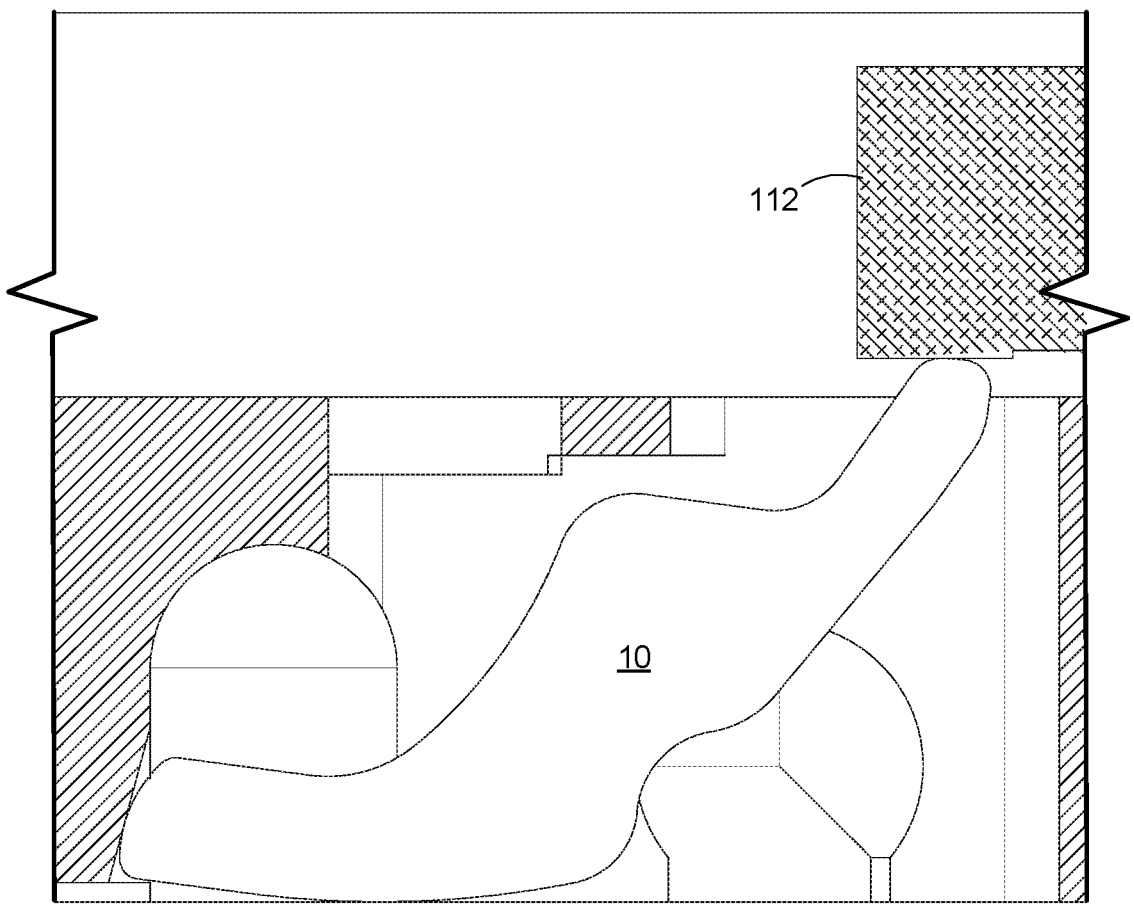
FIG. 13 is a close up side plan view of a test pin in the housing of FIG. 12.

FIG. 13 is a schematic view of a test pin 10 engaging the DUT 112.

Figure 1:
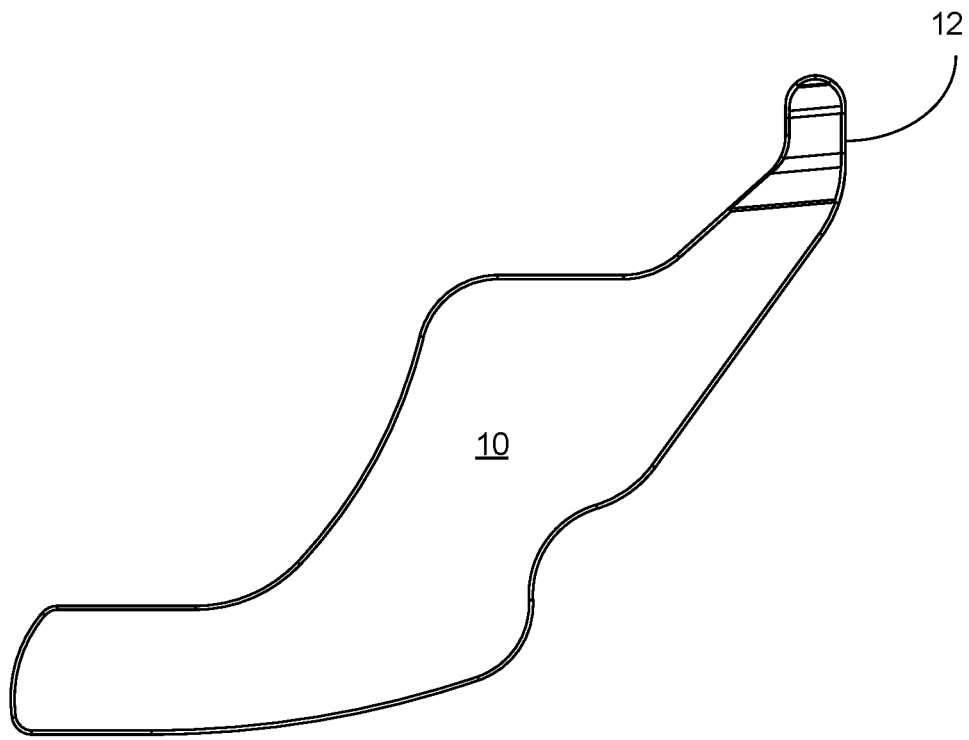
FIG. 1 is a side plan schematic view of a test pin.
Figure 2:
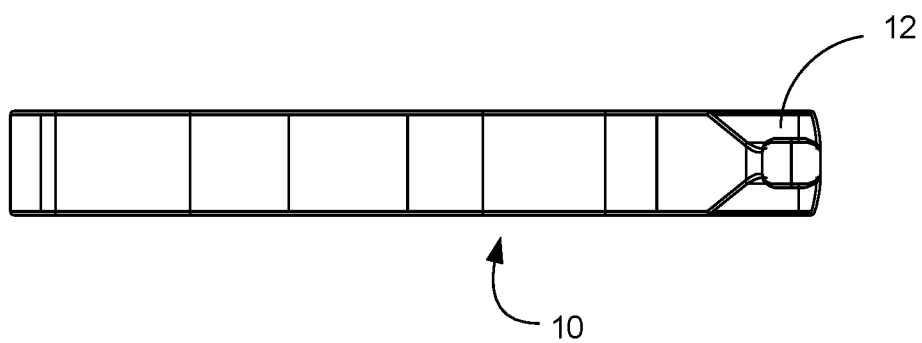
FIG. 2 is top plan view of the embodiment in FIG. 1.
Figure 3:
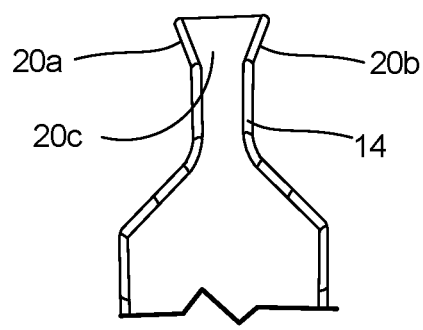
FIG. 3 is close up end view of the embodiment in FIG. 1.
Figure 4:
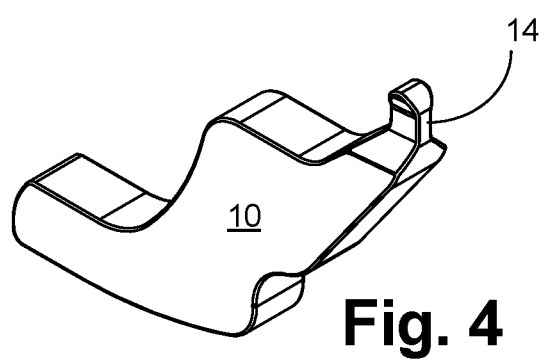
FIG. 4 is a top perspective view of a second embodiment of a test pin.
Figure 5:
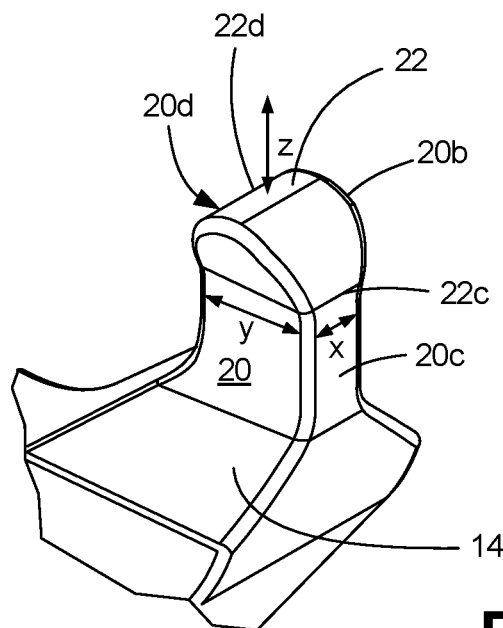
FIG. 5 is a close up perspective view of the tip of the test pin in FIG. 4.
Figure 14:
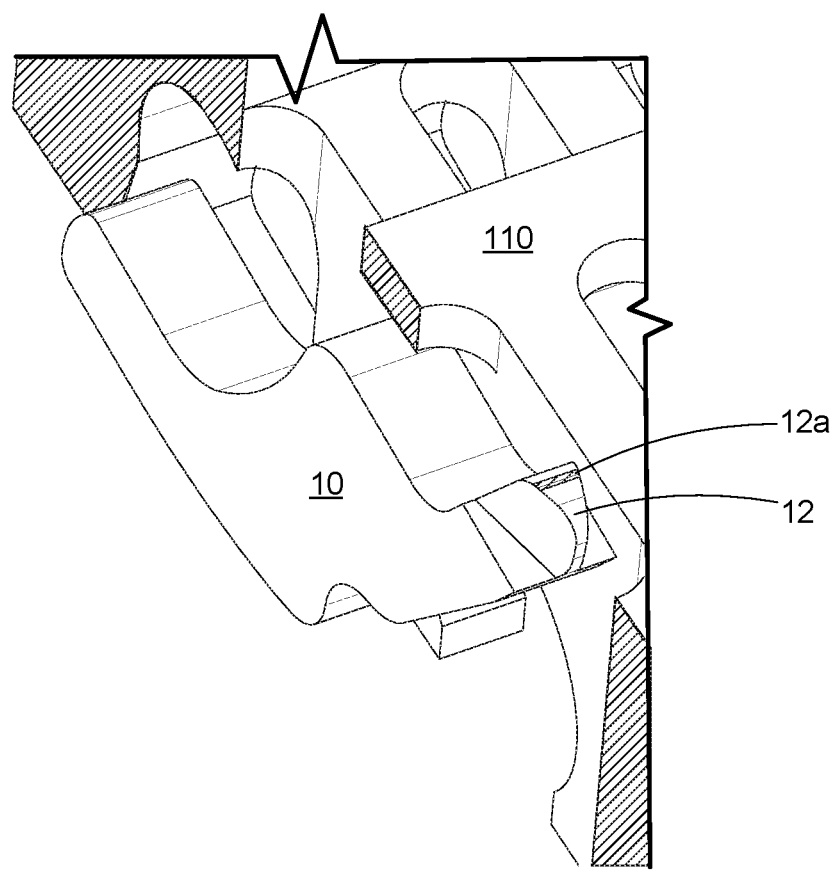
FIG. 14 is a top perspective view of FIG. 13.
Figure 15:
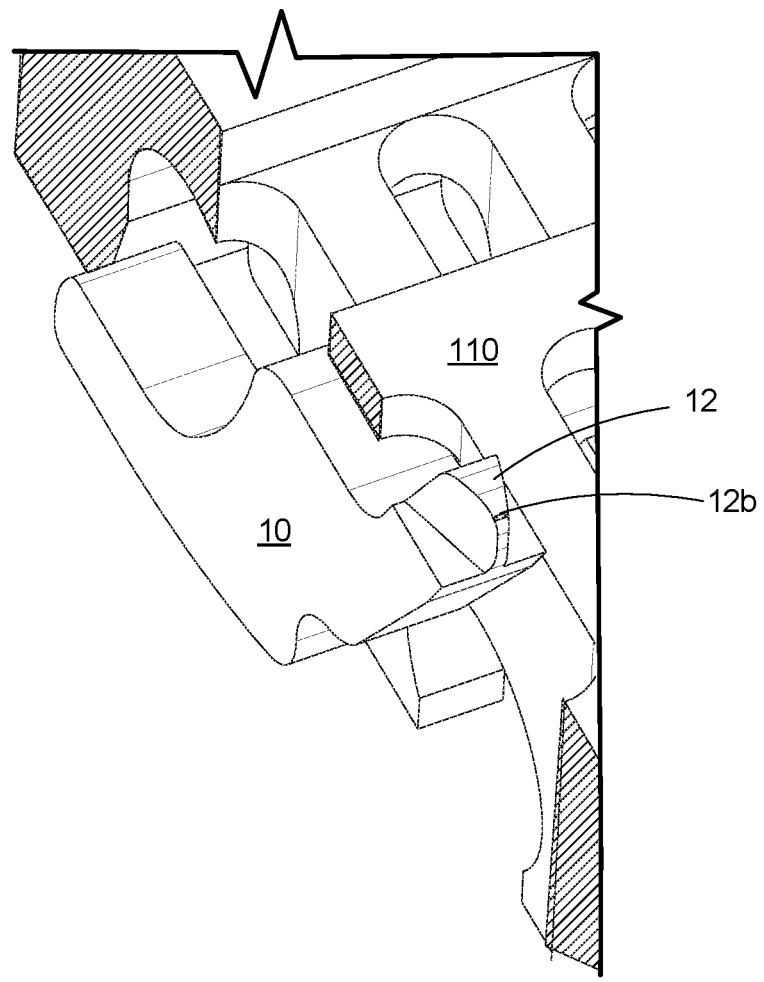
FIG. 15 is a fig. like FIG. 14 with the contact tip worn.
Figure 16:
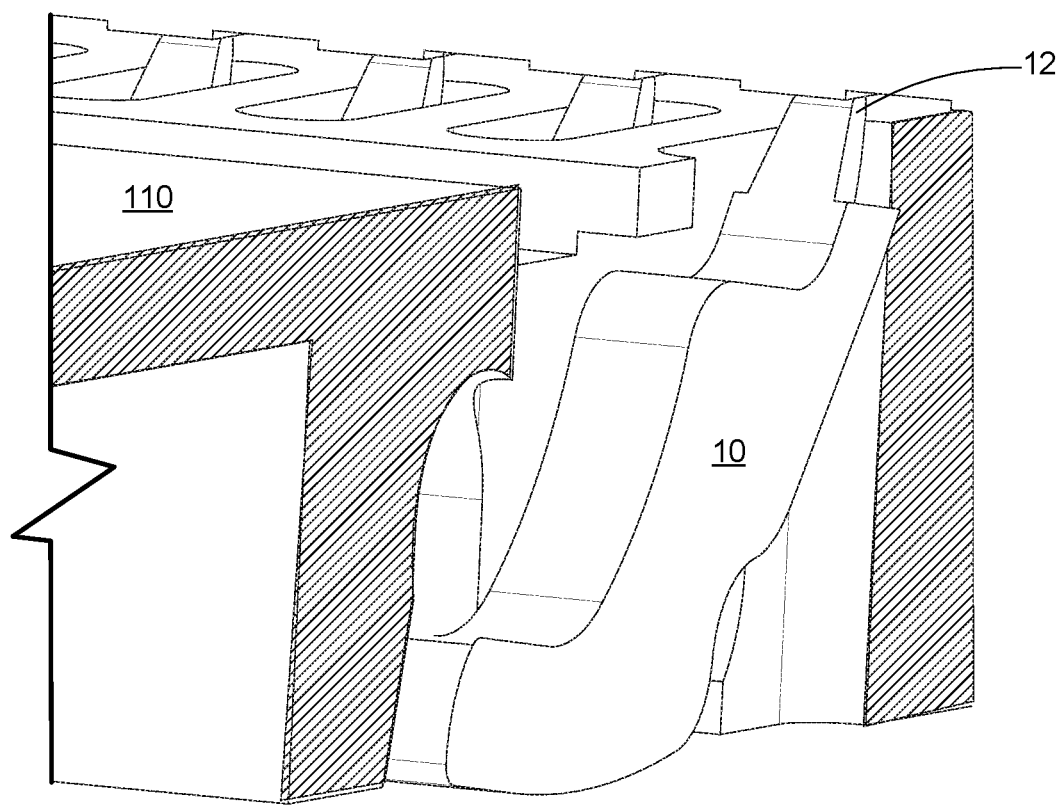
FIG. 16 is side perspective view of FIG. 15.

FIGS. 1-3 illustrate a pin 10 having a tip 12. FIGS. 14, 15 and 16 illustrate a similar pin in a housing. FIGS. 14, 15 and 16 show a case where the contact tip is narrow in the location where it initially touches the DUT (FIG. 1 label 12b), and the area of the contact tip that touches the DUT becomes wider as the contact is compressed. FIG. 14 shows a highlighted area 12a where the wider contact tip will touch the DUT when the contact is fully compressed. This happens because in this embodiment, the tip rolls from narrower to wider as the tip is defected and the elastomer pressure on the tip increases. By widening out the tip contact area the tip pressure is maintained more or less constant. In the embodiment shown in FIGS. 14-15, the tip has a reverse taper in the direction in which it rolls during compression/deflection so that the tip is wider as it is deflected.

Figure 17:
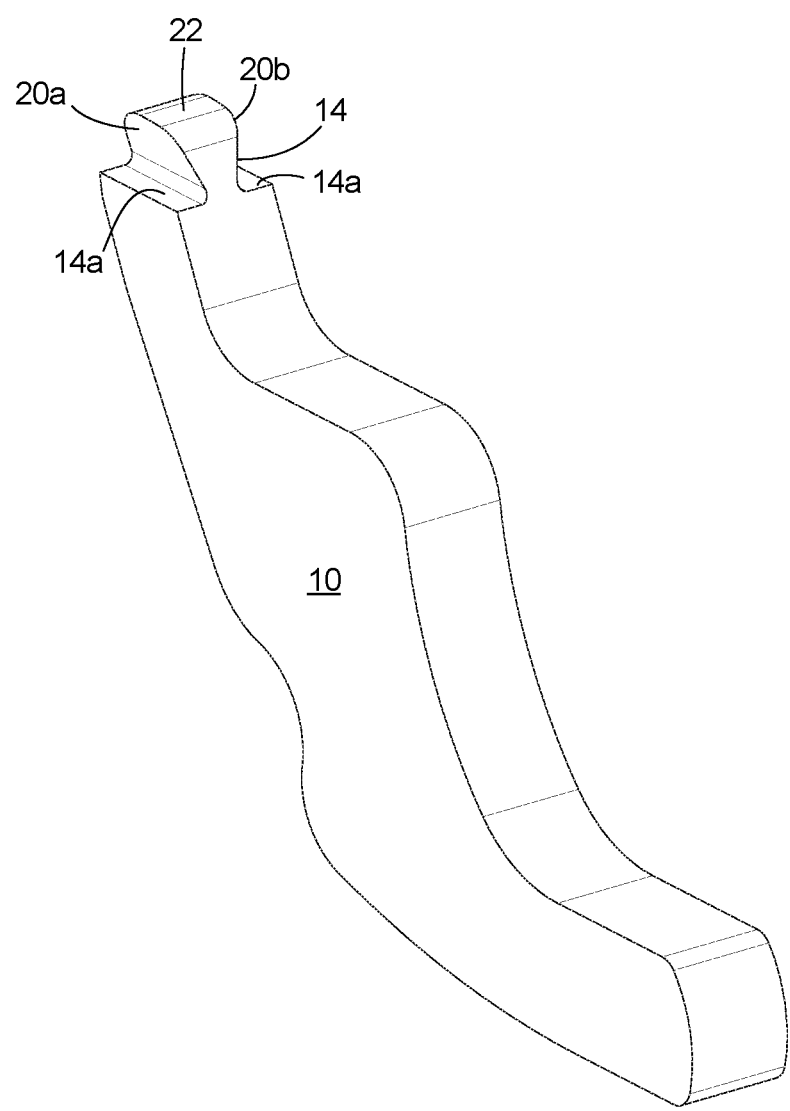
FIG. 17 is a perspective view of like FIG. 4 but with a shorter neck.
Figure 18:
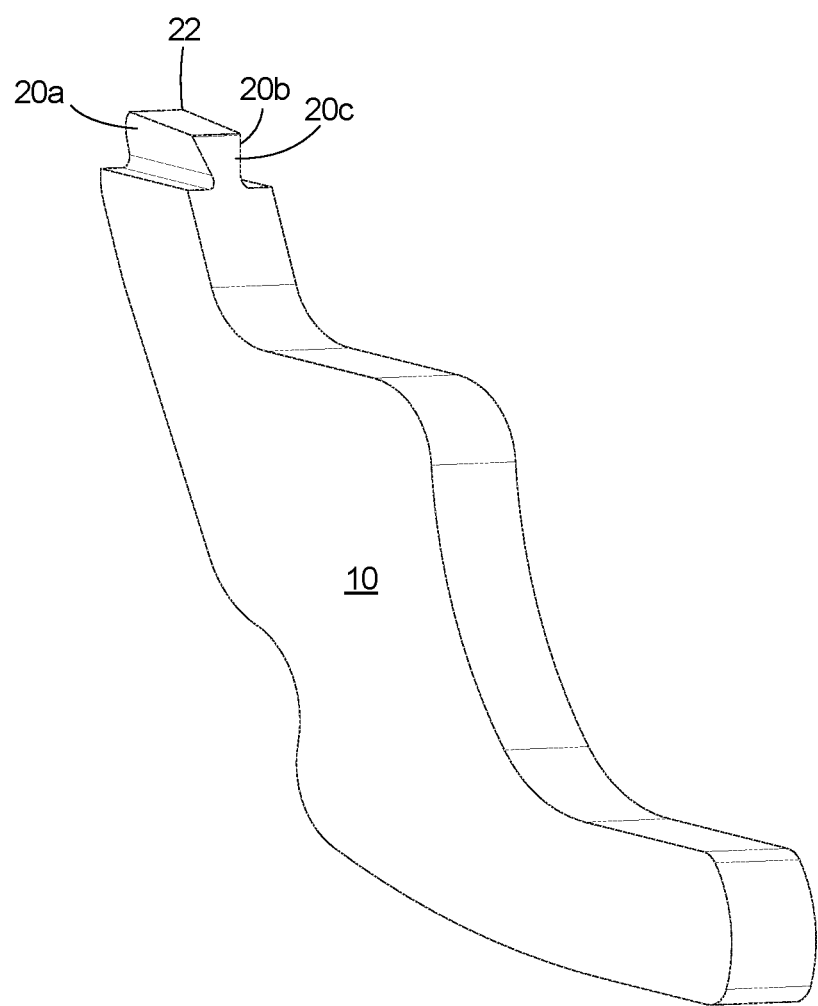
FIG. 18 is a view like FIG. 17 but with flat tip.

It can be seen in FIG. 16 that this configuration of the contact tip does not taper in the Z direction. This contact design configuration would be appropriate for testing applications where the contact tip does not wear over time. FIG. 18 is similar to FIG. 17 except that it shows greater tip wear. The operation of the pin in the housing is known from cited references referred to and incorporated in this document.

Just below the tip 12 is a tip neck 14 which may be a constructed portion as shown or the same thickness as the body of the pin. Rising from the neck are 2 pairs of opposing sidewalls 20a-20b and 20c-20d. The walls may also be curved or form a cylinder. For simplicity the sidewalls 20a-20b will be designated the X direction, 20c-d the Y direction, and top surface 22 in the Z direction. In FIG. 17, the neck portion is either very small or zero in length where the opposing converging sidewalls 20a/20b extend immediately from the base 14a, which in this embodiment is formed of generally planar/flat ledges 14a.

Top surface 22 is cylindrical or hemispherical depending on whether the stress relief is in the x, y, z axis or some or all of them.

Notice that the edge 22c of surface 22 (adjacent sidewall 20c, will encounter the DUT test pad first on insertion. As the pin is deflected downwardly into the housing, the DUT pad will either move along the surface 22 toward edge 22d or stay primarily stationary. As the pin is deflected downwardly, the force on the tip is increased, because of the compression of resilient members (not shown) which bias the pin toward the DUT. The force may or may not increase linearly depending mostly on whether the supporting elastomers (not show) have expansion space or not.

Figure 19:
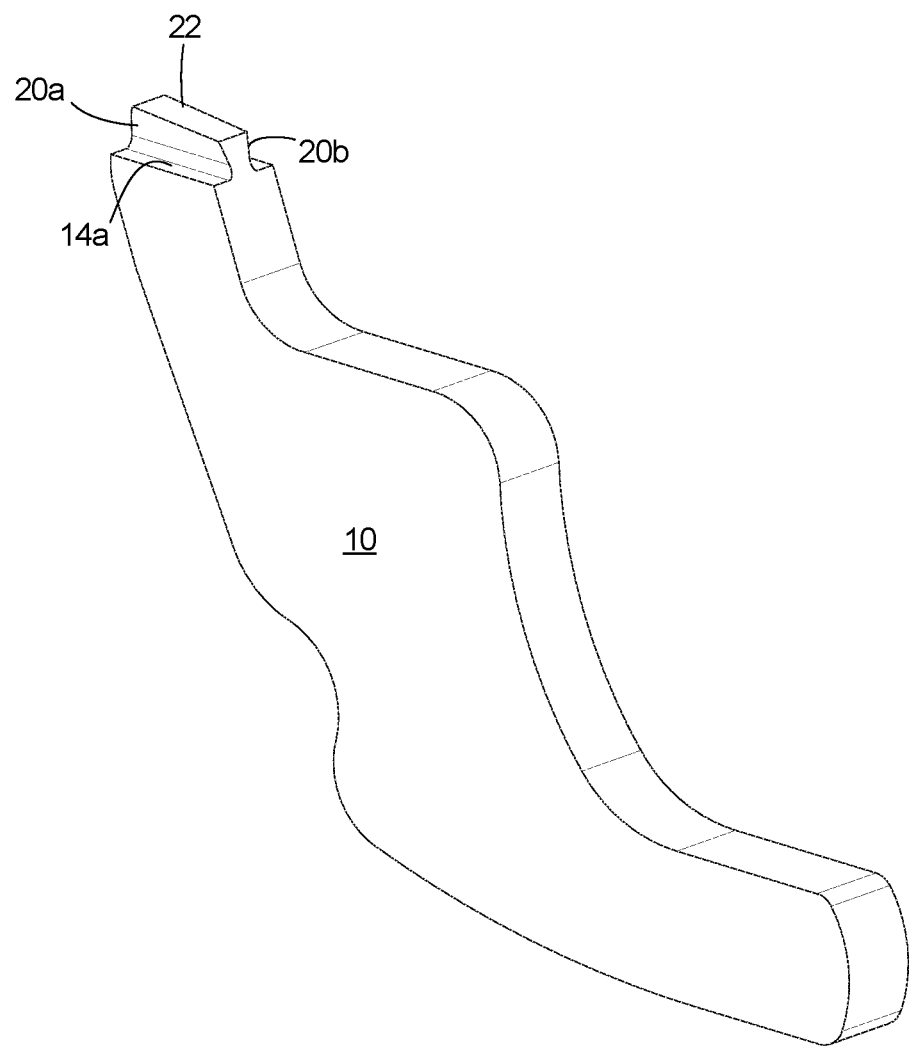
FIG. 19 is view like FIG. 18, with a shorter neck and flat tip.
Figure 20:
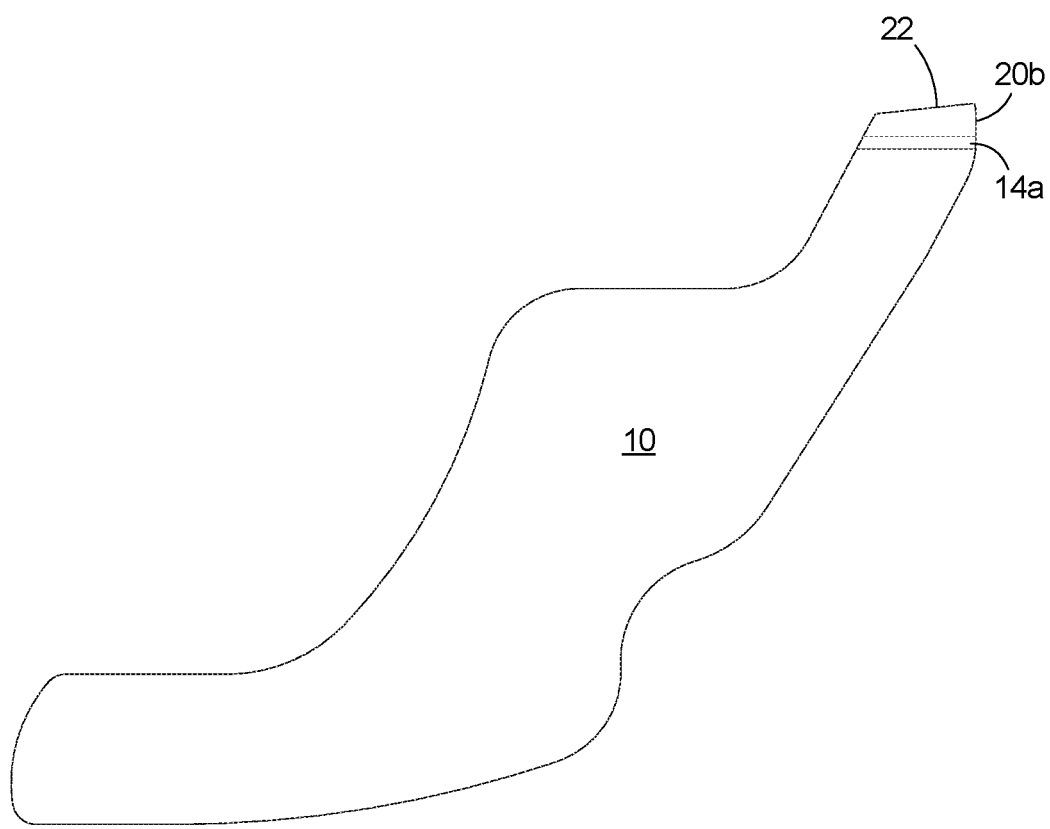
FIG. 20 is a side view of FIG. 18.
Figure 21:
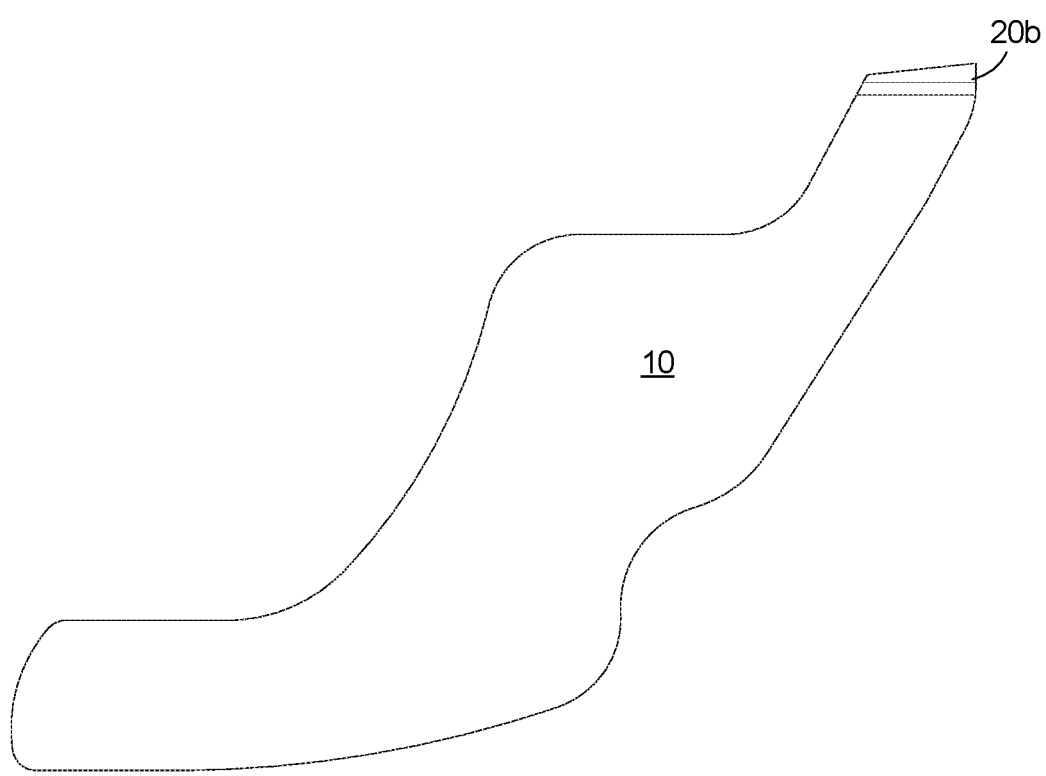
FIG. 21 is a side view of FIG. 19.

Another objective of this disclosure is to provide a way to maintain pin pressure as the tip wears. As seen progressively in FIGS. 17-19, the top surface of the pin 22 may wear after repeated engagement with DUTs. The height of the tip will thus become lower. To compensate and maintain pin to DUT pressure, the width of the tip can become narrower. This is accomplished by tapering the tip as it approaches the base of the pin head 14a. Thus walls 20a/b are tapered/narrowed/inwardly inclined, so that as the pin 22 erodes, the surface area in contact with the DUT pad/ball is smaller, keeping the pressure/unit area relatively constant. The contact surface area is the area of the tip which is intended to make contact with the DUT contact (ball, pad, etc.). Of course this area may vary with the variability of the DUT contact shape and size. That is unimportant. The important factor is that as the tip wears, the shape of the neck is tapered so that the tip contact area will necessarily decrease as it worn away. If one where to take sectional slices of the tip surface as it wears down the neck, these slices would appear as having progressively slightly smaller surface areas which would contact a DUT or succession of DUTs as they are tested.

Figure 22:
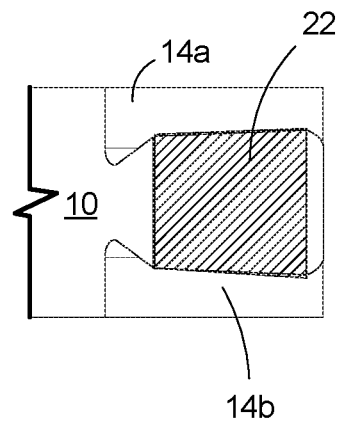
FIG. 22 is a top view of the tip portion of FIG. 18.
Figure 23:
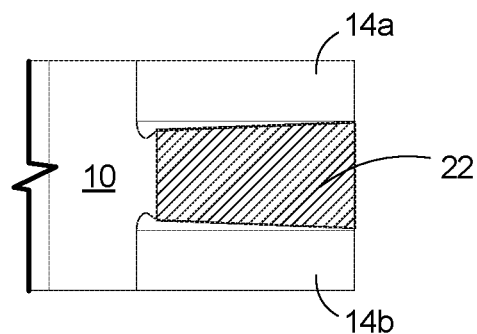
FIG. 23 is a top of the tip portion of FIG. 19.

As seen from the front, surface 20c is more or less triangular. FIGS. 18-22 show tip 14a as a planar surface in the alternative. FIGS. 22-23 illustrate a top view of the pin tips 22. In the figures, the surface area is decreased by the tapered sidewalls of the neck. That can be one, two three or all four sidewalls tapered simultaneously. It could also be a tapered cylinder (cone) or other taper shape, regular or irregular. The important element is that the contact surface area (i.e. what actually contacts the DUT pad or pin) is getting smaller as the tip wears. This will offset the decreasing height of the wearing pin because the decreased height reduces pin tip force.

A method of manufacturer is also disclosed including any or all of the following steps in any order:

a method of maintaining relatively constant tip pressure between a device under test (DUT) and a test pin in a test housing, the pin having a tip which has a contact surface comprising:
  a. forming the tip of the pin so that it has a pin tip and tapering sidewalls extending away from the pin tip. The top may have a curved surface to allow smooth rolling action.
  b. forming an expanding tip contact surface from a point of initial contact with the DUT to a point of final contact with the DUT as it is inserted into the housing, where the tip contact surface is larger toward the point of final contact with the DUT, because the contact tip exerts more force against the device when the contact pin is fully compressed.

Also disclosed is a method of maintaining relatively constant tip pressure as a result of increased forces on the tip when deflected against an elastic force. The method of reduces tip pressure between a device under test (DUT) and a test pin in a test housing, the pin having a tip which has a contact surface comprising:
  a. forming the tip of the pin so that it has a curvature on its contact surfaces, so that when it engages a contact of a DUT, the area of contact between the tip and DUT travels along the tip surface;
  b. forming a declining tip height along the tip contact surface from a point of initial contact with the DUT to a point of final contact with the DUT as it is inserted into the housing, where the tip height is lower toward the point of final contact. The lower tip is slightly more distant from the DUT and hence when deflected, the tip withdraws slightly compensating for the increased pressure during deflection.

Also disclosed is a controlled pressure test pin for use in a test pin housing on a device under test (DUT) the pin comprising any or all of the following elements:
  a. a tip formed at an end of the test pin, the tip being configured to engage a contact on the DUT from an initial point where the tip first engages the DUT to a final point where the DUT is in a test position in the housing, during which the pin is deflected into the housing,
  b. said tip having a top surface configured to engage the DUT, said top surface being narrower at the point of initial engagement than at said final point, so that pressure between the tip and the DUT will tend to be more constant instead of rising as tip deflection increases.

A controlled pressure test pin for use in a test pin housing on a device under test (DUT) the pin comprising any or all of the following elements:
  a. a tip formed at an end of the test pin, the tip being configured to engage a contact on the DUT from an initial point where the tip first engages the DUT to a final point where the DUT is in a test position in the housing, during which the pin is deflected into the housing,
  b. said tip having a top surface configured to engage the DUT, said top surface being higher at the point of initial engagement than at said final point so that pressure between the tip and the DUT will tend to be more constant instead of rising as tip deflection increases.

A controlled pressure test pin for use in a test pin housing on a device under test (DUT) the pin comprising any or all of the following elements:
  a. a tip formed at an end of the test pin, the tip being configured to engage a contact on the DUT from an initial point where the tip first engages the DUT to a final point where the DUT is in a test position in the housing, during which the pin is deflected into the housing,
  b. said tip having a top surface configured to engage the DUT, said top surface being higher at the point of initial engagement than at said final point so that pressure between the tip and the DUT will tend to be more constant instead of rising as tip deflection increases; and
  c. said tip having a top surface configured to engage the DUT, said top surface being higher at the point of initial engagement than at said final point so that pressure between the tip and the DUT will tend to be more constant instead of rising as tip deflection increases.

Figure 9:
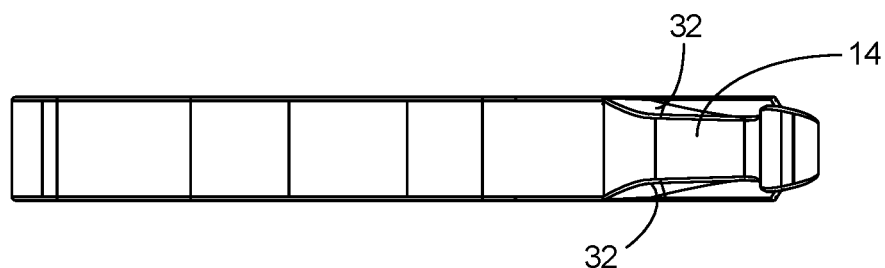
FIG. 9 is an end view of the pin in FIG. 8.
Figure 10:
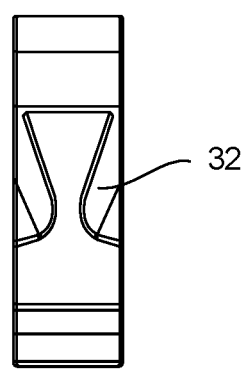
FIG. 10 is a close up top view of the pin in FIG. 8.
Figure 11:
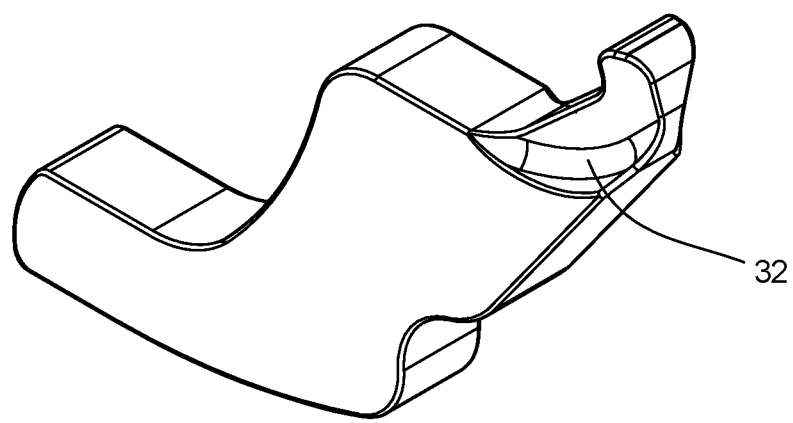
FIG. 11 is a perspective view of a fourth embodiment of a test pin.
Figure 11A:
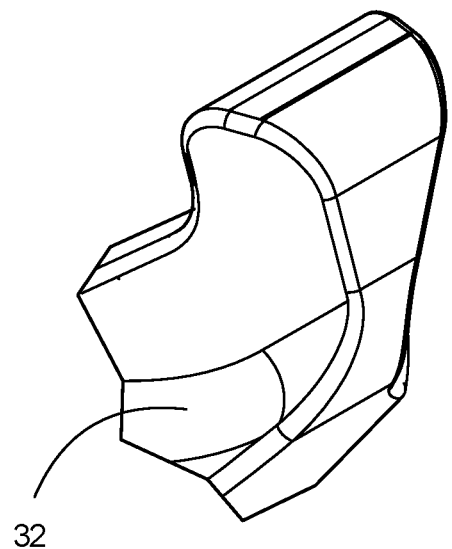
FIG. 11a is a close up view taken from circle A of FIG. 11.

FIGS. 9 and 10 illustrate the curvature as well. In FIGS. 11-11a this curvature can be seen an undercutting/sculpting away (radiussing of) a portion of the neck at its rear sidewalls to thin the neck.

As mentioned, one objective of this disclosure is to show a structure for maintaining tip pressure as tip wear increases. Another objective is to maintain tip pressure as the tip is deflected downwardly and the supporting elastomer is compressed and tip pressure would increase. With respect to this second is issue, to prevent tip pressure from increasing due to deflection against an elastomer, one of the following design options on the tip may be employed:

1. The width of the tip from 22c to 22d is progressively widened so that the pressure on the tip is spread over a larger surface area as the tip rolls on deflection. The FIGS. 14-15 as mentioned above show the tip widening as the tip rolls in response to engagement with the DUT. An alternative (or addition) to widening the tip as it is deflected, is to have its height of surface 22 recede from edge 22c to edge 22d. One profile would be a wedge/slanted shape with the lower edge trailing (near 22d) so that pressure is reduced as the tip rolls over the DUT and the elastomers are compressed. The wedge can be in the form of a curved surface, such as convex as shown.

Figure 6:
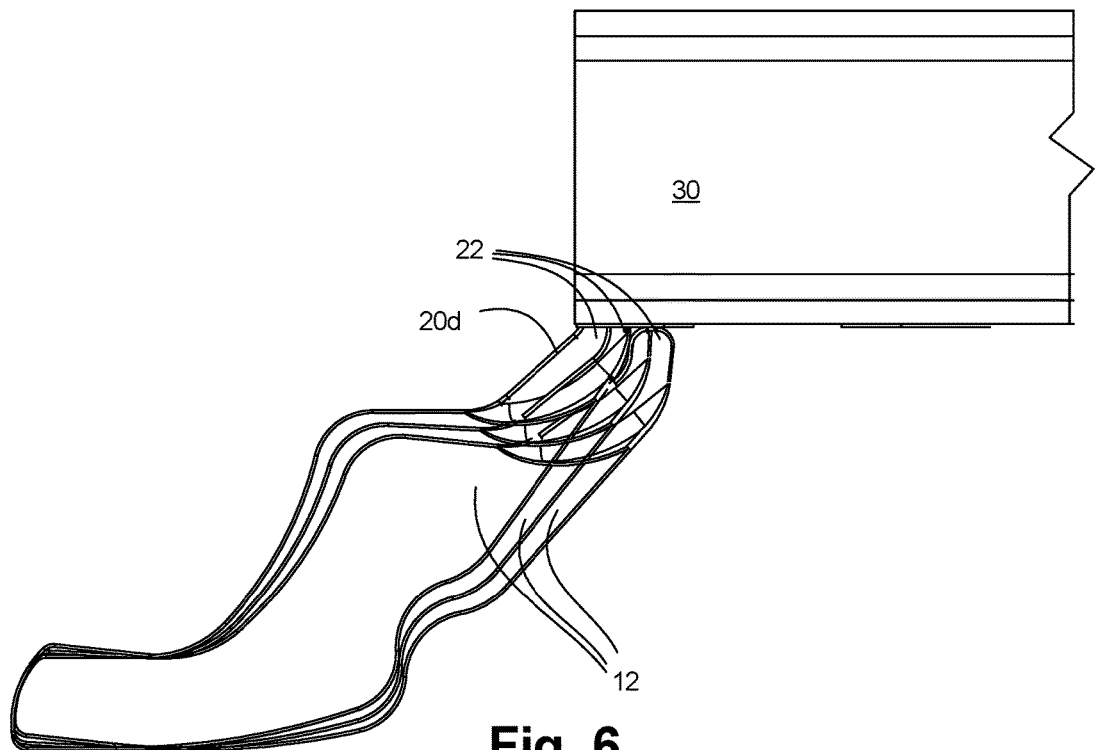
FIG. 6 is a side view of the tip in multiple positions.

In FIG. 6 it can be seen how tip 12 shown in three positions, will engage the DUT 30 in positions A, B, C (actually continuously) during travel.

Figure 7:
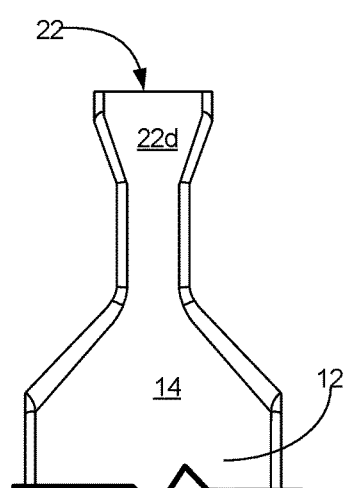
FIG. 7 is a close up end view of the pin in FIG. 4.

FIG. 7 illustrates an end view of the tip.

Figure 8:
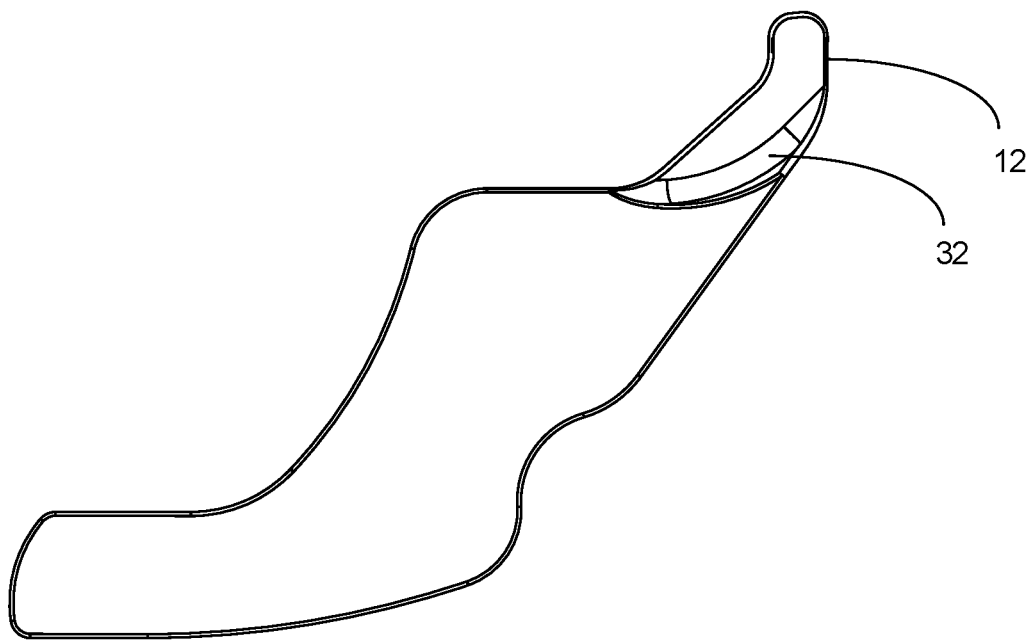
FIG. 8 is a side plan view of a third embodiment of a test pin.

FIG. 8 illustrates a side view having a curvature 32 of the neck 14 showing a gradual thinning of the neck as it reaches the tip and widening as it reaches the base of the neck, to provide greater strength.

The above description and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A controlled pressure test pin for use in a test pin housing testing a device under test (DUT), the pin comprising:
    a. a test pin having sidewalls;
    b. a tip formed at a distal end of the test pin, the tip having tip sidewalls and a distal tip surface, thereby defining a tip surface area between the tip sidewalls at said distal tip surface, and being the surface area of the tip during which the pin is deflected into the housing; and
    c. said tip including a neck portion having a proximal point and a distal end, the neck portion extending from said proximal point to said distal end distal tip surface toward said distal end of said pin, said tip engaging said DUT, said neck portion having a tapering width from said distal end toward said proximal point, so that as said distal tip surface is worn by repeated contact with said DUT, said tip surface area of the tip surface which engages the DUT is progressively decreased.

2. A controlled pressure test pin system configured to compensate for pin wear, for use in a test pin housing which receives a device under test (DUT); the pin comprising:
    a. a tip formed at a distal end of the test pin, the tip being configured to engage a contact on the DUT where the DUT is in a test position in the housing, during which the pin is deflected into the housing against an elastomeric bias force,
    b. said tip having a top surface configured to engage the DUT, said top surface being higher in the housing at the point of initial engagement than at said final point when deflected by engagement with the DUT; and
    c. said tip having a top surface configured to engage the DUT, said top surface having a predetermined width, with the tip having a progressively widening width as it approaches the test pin distal end, so that when the top surface of the pin is deflected downwardly by the DUT, the width of the top surface will be progressively widened thereby maintaining the tip pressure where it engages the DUT to compensate for increasing elastomeric bias force as the tip is deflected.

3. The test pin of claim 2 wherein the neck portion includes:
    a. a tapered portion from the distal tip surface;
    b. said tapered portion being joined at one end to a portion of spaced apart sidewalls and a fixed width; and
    c. said tapered portion being joined at another end to a lower neck portion, which in turn is connected to the distal end of the test pin, the lower neck portion having a reverse taper which widens to mate with the distal end of the test pin.

4. The test pin of claim 3 wherein said lower neck portion further includes a radiussed recess therein.

5. The test pin of claim 3 wherein said neck portion has at least two tapered sidewalls.

6. The test pin of claim 3 wherein said neck portion has at least four tapered sidewalls.

7. The test pin of claim 3 wherein said tip is curved.

8. The test pin of claim 3 wherein said tip is planar.

9. The test pin of claim 2 wherein said tip has a width and length and wherein said width is tapered.

10. The test pin of claim 2 wherein said tip has a width and length and wherein said length tapered.

11. A method of reducing tip pressure between a device under test (DUT) and a test pin in a test housing, the pin having a tip which has a contact surface comprising:
    a. forming the tip of the pin with a curvature on its contact surfaces, so that when it engages a contact of a DUT, the area of contact between the tip and DUT travels along the curved tip surface; and
    b. forming a widening the tip with a progressively widening tip width as measured from an initial point of contact with the DUT to the final point of contact with the DUT when the DUT is inserted into the housing, where the tip contact surface is progressively wider from the initial point of contact to the final point of contact with the DUT thereby generally maintaining tip to DUT pressure.

* * * * *